United States Patent [19]

Small, Jr.

[11] Patent Number: 4,554,229
[45] Date of Patent: Nov. 19, 1985

[54] MULTILAYER HYBRID INTEGRATED CIRCUIT

[75] Inventor: Richard D. Small, Jr., Lawrence Township, Mercer County, N.J.

[73] Assignee: AT&T Technologies, Inc., Berkeley Heights, N.J.

[21] Appl. No.: 597,626

[22] Filed: Apr. 6, 1984

[51] Int. Cl.⁴ .......................... G03C 3/00; H05K 1/00
[52] U.S. Cl. .................................. 430/17; 430/280;
430/286; 430/920; 428/901; 361/412; 174/68.5
[58] Field of Search ............... 430/280, 286, 287, 14,
430/17, 314, 315, 319, 920; 361/397, 412;
174/68.5; 428/901

[56] References Cited

U.S. PATENT DOCUMENTS

| | | | |
|---|---|---|---|
| 3,397,204 | 8/1968 | Gaertner | 260/248 |
| 3,900,594 | 8/1975 | Guthrie et al. | 427/53 |
| 4,054,483 | 10/1977 | Peiffer | 156/632 |
| 4,060,656 | 11/1977 | Naka et al. | 428/355 |
| 4,320,189 | 3/1982 | Taguchi et al. | 430/288 |
| 4,329,384 | 5/1982 | Vesley et al. | 428/40 |
| 4,357,219 | 11/1982 | Sattler | 204/159.15 |
| 4,456,712 | 6/1984 | Christie et al. | 523/439 |

Primary Examiner—John E. Kittle
Assistant Examiner—José G. Dees
Attorney, Agent, or Firm—J. F. Spivak

[57] ABSTRACT

A multilayer circuit device comprises a substrate having a plurality of metallized patterns thereon said patterns being separated by a photodefined polymeric dielectric film formed from a polymeric photodefinable triazine base mixture including a photosensitive acrylate moiety. The various circuit patterns are interconnected by means of microvias through the polymeric film or film layers.

9 Claims, 1 Drawing Figure

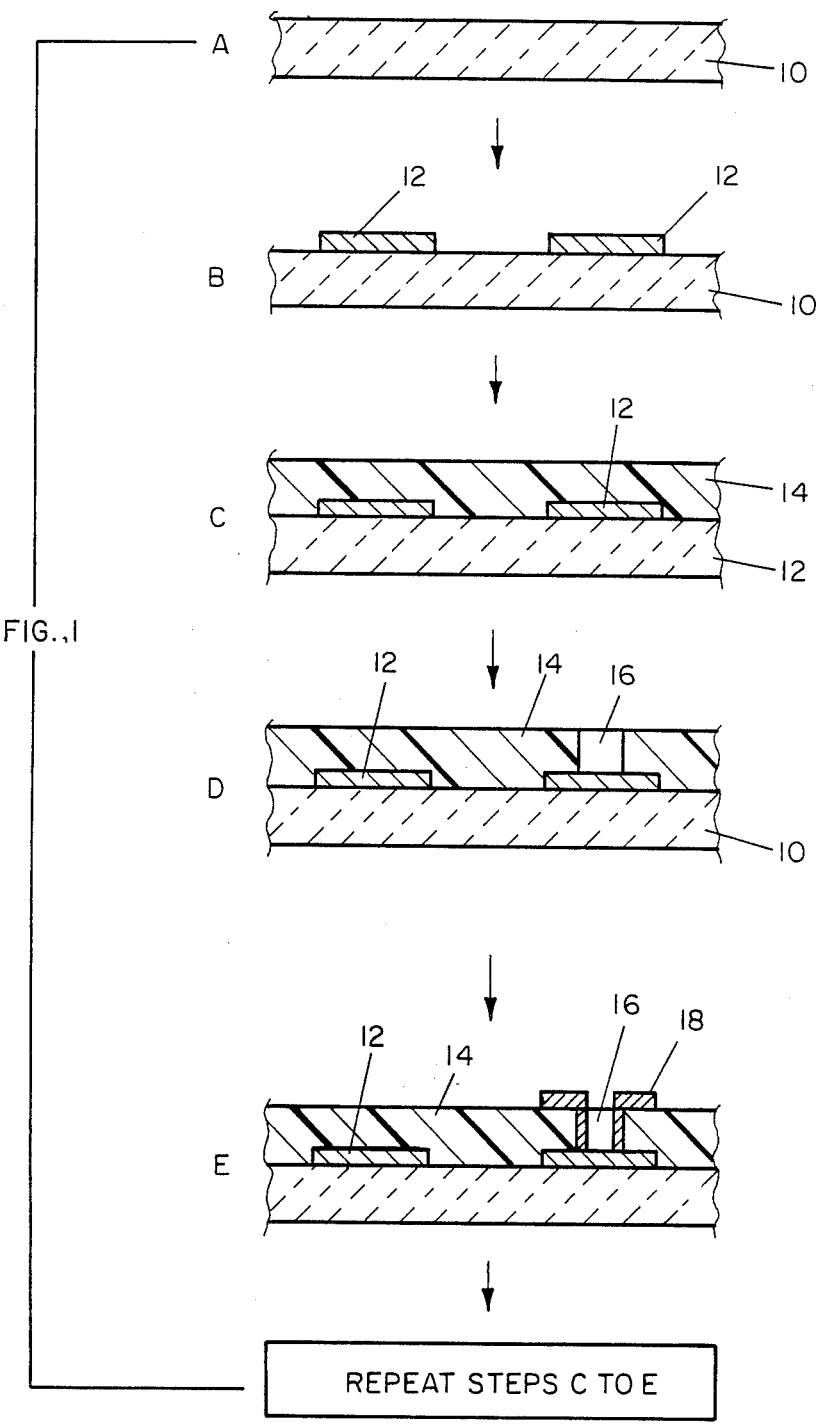

MULTILAYER HYBRID INTEGRATED CIRCUIT

TECHNICAL FIELD

This invention relates to multilayer hybrid integrated circuits and more particularly to the novel dielectric layer employed as part of the circuit.

BACKGROUND OF THE INVENTION

In the evolution of hybrid integrated circuits for switching systems and high performance processes as well as other electronic devices one of the most critical system packaging needs is the capability of utilizing effectively high I/O pin-out devices with high speed interconnections. To meet this goal multilayer ceramic hybrid integrated circuits have been developed. However, the currently available multilayer ceramic circuits require a complex manufacturing system and are relatively expensive. Consequently, in order to meet the packaging needs of such hybrid integrated circuits while retaining quality, reliability and performance demands, especially in conjunction with the use of very large scale integrated circuit chips, in a cost competitive package, further improvements are necessary.

To meet this goal, I believe that a multilayer polymer hybrid integrated circuit configuration is one approach to solving the problem. The polymer layer must act as a dielectric material between layers containing thin film circuitry and must meet many other stringent requirements including a high $T_g$, a high thermal stability and hybrid process compatibility. It would also be preferred if such a polymeric material were photodefinable.

SUMMARY OF THE INVENTION

A multilayer circuit device comprising a substrate having a metallized pattern thereon and a plurality of polymeric dielectric film layers each having a metallized circuit pattern thereon with metallized microvias interconnecting the metallized patterns of one layer with that of at least one other metallized layer thereunder, said polymeric dielectric layer being formed from a photodefinable triazine base mixture including a photosensitive acrylate moiety.

BRIEF DESCRIPTION OF THE DRAWINGS

The FIGURE is a cross-sectional elevational view representing processing steps, A to E, in forming a device in accordance with the invention.

DETAILED DESCRIPTION

It should be understood that the novel device as summarized above is suitable for use as a multilayer printed circuit board employing substrates which are commonly used and are well known in the printed circuit board industry. Also, because of the characteristics of the triazine based dielectric layer employed, the device is especially suited for use in what is known as a multilayer hybrid integrated circuit device generally employing a ceramic substrate.

To meet the requirements of advancing technology involving hybrid integrated circuits for switching systems and high performance processes, a multilayer hybrid integrated circuit must be capable of employing a high number of I/O pin-out devices with high speed interconnections. Due to the heat developed and the electrical requirements, minimum requirements for the dielectric material employed to separate conductor layers include a glass transition temperature ($T_g$) of at least 140° C. and good thermal stability to about 220° C., a dielectric constant of no greater than 3.5 and preferably, the material should be capable of being imaged by means of actinic radiation so as to be able to achieve fine line features and an aspect ratio approaching 1. In addition, the dielectric materials must be tough enough to withstand thermal cycling specifications with severe mismatch in dimensional stability between the ceramic substrates and the dielectric materials; the dielectric must be compatible with typical ceramic resistors and conductors under accelerated life testing and the surface of the dielectric must be metallizible so as to form at an adherent circuit pattern thereon. In addition, the dielectric material must have chemical resistance to all chemicals used in further processing steps and should be in a form that can be coated reproducibly and efficiently. The polymeric dielectric material must also have good high voltage breakdown characteristics and be compatible with all other components and materials employed. Preferably, for commercial purposes, good shelf stability and shelf life of the uncured polymer is required. Heretofore, polymeric dielectric materials meeting these requirements were not available.

I have now discovered that a polymeric mixture having a triazine resin as its primary constituent and including a photosensitive acrylate moiety crosslinking agent can be used to achieve the necessary goals. The acrylate moiety can be on a separate compound or on the triazine itself. More particularly, a suitable polymeric dielectric formulation giving the ranges of its constituents in weight percent is as follows: triazine, 40–65%; rubber resin, 0–30%; an epoxy-acrylate hybrid resin or individual epoxy and acrylate resins totaling from 0–50%; a hardener, 0–12%; a crosslinking agent, 0–8%; a coupling agent, 0–5%; and a photoinitiator, $\frac{1}{2}$–3%.

The preferred rubber resins are acrylonitrile butadiene resins. It is preferred that a hybrid epoxy-acrylate resin be employed rather than individual separate epoxy resin and acrylate resin. Such hybrid resin may be epoxy terminated or vinyl terminated. For example, the half acrylate of the diglycidyl ether of bisphenol-A is suitable. A particularly suitable hardener is N-vinylpyrrolidone. Further, a particularly suitable crosslinking agent is trimethylolpropanetriacrylate. Also a particularly suitable coupling agent to enhance the adhesion of the polymeric dielectric material to the underlying material is a silane coupling agent such as glycidoxypropyltrimethoxysilane. Coupling agents, and in particular silane coupling agents, are well known in the art for enhancing adhesion between dissimilar layers. A suitable photoinitiator is 2,2-dimethoxy-2-phenylacetophenone. In addition to the above, one may also add small amounts of pigment, surfactant and copper chelate thermal stabilizer, e.g., copper benzylacetonate. Such additives are generally included, if desired, in amounts of up to about 1%.

Generally preferred formulations of the triazine mixture are as follows:

(A) triazine 50–60 weight percent; epoxy acrylate hybrid 20–30 weight percent, hardener 5–12 weight percent, crosslinking agent 2–6 weight percent, coupling agent 2–5 weight percent, photoinitiator 1–3 weight percent; or (B) triazine 50–60 weight percent; acrylated rubber 10–25 weight percent, epoxy acrylate hybrid 5–15 weight percent, hardener, crosslinking agent and photoinitiator as in (A); or (C) triazine 50–55 weight percent; acrylated rubber 20–30 weight percent and the remainder of the ingredients as in (B) plus pigment, surfactant and stabilizer up to 1 weight percent.

More specific examples of suitable photodefinable resin mixtures utilized to form the polymeric dielectric are as follows:

EXAMPLE I

| Component | Weight Percent |
|---|---|
| Triazine | 56% |
| Half acrylate of the diglycidyl ether of bisphenol-A (Celanese) | 25% |
| N—vinylpyrrolidone | 9% |
| Trimethylolpropanetriacrylate | 4% |
| Glycidoxypropyltrimethoxysilane | 4% |
| 2-2-dimethoxy-2-phenylacetophenone | 2% |

EXAMPLE II

| Component | Weight percent |
|---|---|
| Triazine | 52% |
| Acrylated acrylonitrile butadiene rubber | 16% |
| Half acrylate of the diglycidyl ether of bisphenol-A | 9% |
| N—vinylpyrrolidone | 9% |
| Epoxy propylacrylate | 3.5% |
| Trimethylolpropanetriacrylate | 4% |
| Glycidoxypropyltrimethoxysilane | 4.5% |
| 2,2-dimethoxy-2-phenylacetophenone | 2% |

EXAMPLE III

The basic formulation of this example is as follows:

| Component | Weight Percent |
|---|---|
| Triazine | 50% |
| Acrylated acrylonitrile butadiene rubber | 26% |
| Half acrylate of the diglycidyl ether of bisphenol-A | 9% |
| N—vinylpyrrolidone | 9% |
| Trimethylolpropanetriacrylate | 4% |
| Glycidoxypropyltrimethoxysilane | 2% |
| Added to this basic formula is the following: | |
| 2,2-dimethoxy-2-phenylacetophenone | 2% |
| Magenta pigment | 0.5% |
| Surfactant | 0.2% |
| Copper benzyl acetonate | 0.5% |

The various photodefinable triazine resin mixtures as set above are employed, as previously indicated, in the manufacture of multilayer circuit devices such as multilayer hybrid integrated circuits. A typical multilayer fabrication process is shown with reference to FIG. 1 A–E. FIG. 1A shows the bare substrate 10 such as an alumina ceramic substrate. FIG. 1B is a representation of the substrate 10 after a conductor pattern 12 has been placed on one surface thereof. This metallized pattern can be formed by any of the well known techniques including thin film technology, thick film technology, vacuum evaporation and electroless plating techniques. Further, while the layer is shown to be patterned to form a circuit one may employ a blanket metallized layer which may be used as a ground plane or power plane for the devices to be attached. FIG. 1C depicts the substrate 10 and first metallized layer 12 with a photodefinable dielectric 14 applied thereover. This dielectric 14 may be applied by any of the well known techniques including screen printing, brushing, spraying, dipping or the like. Subsequent to application of the photodefinable dielectric 14, as shown in FIG. 1D, the photodefinable dielectric 14 is subjected to actinic radiation so as to define microvias 16 which, upon development, are formed therethrough. These microvias 16 allow additional metallization 18 as shown in FIG. 1E to form a contact between adjacent metallized layers. In this way, any desired portions of a top metallized layer may be made to electrically contact any lower metallized layer. Steps 1C to 1E can be repeated to build as many levels as needed or desired. Discrete devices such as integrated circuit chips, resistors, capacitors or the like can be mounted such as by surface mounting techniques or any other available techniques known to the art to any of the metallized layers or preferentially to the top layer. Upon completion, a complete hybrid integrated circuit package is formed. In order to achieve a commercially feasible hybrid integrated circuit for high density packaging of integrated circuit devices and a large number of I/O pin counts, the polymeric dielectric material should have the following properties. Where, however, the use is not so stringent and a high number of I/O pin counts is not necessary and lower power is to be used the following requirements may be relaxed. The various requirements and the performance of the photodefinable triazine mixtures as set forth herein with respect to those requirements are given in the table below.

| Specific Material Requirements | | |
|---|---|---|
| Parameter | Requirement | Photodefined Triazine Performance |
| $T_g$ | >130° C. | 150–190° C. |
| Thermal stability | | |
| Long term | 100° C. | 180° C. |
| Short term | 125° C. | 210° C. |
| Spikes | 300° C.-10-15 sec. | Passes |
| Dielectric constant | <4.0 | 3.4–3.6 |
| Resistor compatibility Thin film | Yes | Yes |
| Via-resolution | ~3 mil minimum | ~3 mil min. |
| Chemical resistance | Not sensitive to any of the process chemicals | Passes |
| Leakage current | <1 micro amp | <1 micro amp |
| Thermal cycle | 5 cycles 140° C.-40° C. | Pass |

EXAMPLE IV

This example sets forth the essential steps in preparing a multilayer integrated circuit employing one of the novel triazine mixtures as the photosensitive dielectric layer. In accordance with this process, which is just one example of many variations of processes which can be used for preparing a multilayer integrated circuit employing the novel photodefinable dielectric, a substrate is first sputter metallized to form a very thin base metal layer thereon. A photoresist such as Dupont Riston is then applied to the surface and the Riston is exposed and developed so as to form an image of the desired conductor pattern thereon. The exposed metallized layer is then electroplated such as with copper followed by nickel and gold and thereafter the Riston is stripped from the surface and the substrate is etched so as to remove the initially applied sputtered layer. Thereafter the photodefinable dielectric triazine mixture is applied to the surface of the substrate by any of the known coating techniques, e.g., spray coating and is warmed so as to prevent bubble formation. The triazine mixture is then imaged by exposing to actinic radiation in a desired pattern and then developed so as to create microvias in the triazine dielectric layer. The dielectric is cured, e.g., by heating at temperatures from 100° C. to 210° C. Preferably, the surface of the dielectric layer is then treated such as by means of an argon etch so as to enhance the adhesion of that surface for subsequent metallization. Thereafter a metal layer is sputtered onto the surface of the triazine dielectric layer, another layer of Riston is applied over the sputtered layer and the Riston is imaged in a desired pattern and a second metallization layer is built up by electroplating techniques. The Riston is thereafter stripped such as with methylene chloride and the underlying thin sputtered metal layer over which there is no electroplate is removed by etching. By this technique, interconnections between the first and second pattern layers of electroplated conductors are made through the microvias in the triazine dielectric layer. These steps can then be repeated as many times as required to build as many layers as is necessary. Also interconnections can be made between any lower and any upper layer skipping any middle layer if desired. Such techniques would be obvious to one skilled in the art. Subsequent to completing the last layer, circuit devices such as capacitors, resistors and the like can be mounted or formed so as to interconnect with the top conductive layer or pattern. Further, where desired, the pattern may include a ground plane or power plane or both.

The utilization of these materials will also be important in other circuit material applications, such as encapsulants, cover coats and for single polymer layer circuits.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A multilayer circuit device comprising a substrate having a metallized pattern thereon and a plurality of polymeric dielectric film layers each having a metallized circuit pattern thereon with metallized microvias interconnecting the metallized patterns of one layer with that of at least one other metallized layer thereunder, said polymeric dielectric layer being formed from a photodefinable triazine base mixture including a photosensitive acrylate moiety wherein the triazine comprises from 40-65 weight percent of the mixture.

2. The device of claim 1, wherein the triazine mixture comprises 40 to 65 weight percent triazine, 0 to 30 weight percent rubber resin, 0 to 50 weight percent of a member selected from the group consisting of an epoxy acrylate hybrid resin and a combination comprising an epoxy resin and an acrylate resin wherein when the percent of both the epoxy acrylate hybrid and acrylate resin in the triazine mixture is zero, the acrylate moiety is on the triazine molecule, 0 to 12 weight percent of a hardener, 0 to 8 weight percent of a crosslinking agent, 0 to 5 weight percent of a coupling agent and ½ to 3 weight percent of a photoinitiator.

3. The device as set forth in claim 2, wherein the rubber resin is an acrylonitrile butadiene rubber, the epoxy and acrylate is in the form of a hybrid epoxy-acrylate resin which is carboxy or vinyl terminated and the coupling agent is a silane coupling agent.

4. The device recited in claim 3 further including N-vinylpyrrolidone as the hardener, and 2,2-dimethoxy-2-phenylacetophenone as the photoinitiator.

5. The device as recited in claim 2 further including a surfactant and a copper chelate thermostabilizer.

6. The device as recited in claim 1, wherein the triazine mixture comprises:
triazine—50-60 weight percent;
half acrylate of the diglycidyl ether of bisphenol-A—20-30 weight percent;
N-vinylpyrrolidone—5-12 weight percent;
trimethylolpropanetriacrylate—2-6 weight percent;
glycidoxypropyltrimethoxysilane—2-5 weight percent; and
2,2-dimethoxy-2-phenylacetophenone—1-3 weight percent.

7. The device recited in claim 1, wherein the triazine mixture comprises:
triazine—50-60 weight percent;
acrylated acrylonitrile butadiene rubber—10-25 weight percent;
half acrylate of the diglycidyl ether of bisphenol-A—5-15 weight percent;
N-vinylpyrrolidone—5-12 weight percent;
epoxy propylacrylate—1-5 weight percent;
trimethylolpropanetriacrylate—2-6 weight percent;
glycidoxypropyltrimethoxysilane—2-5 weight percent; and
2,2-dimethoxy-2-phenylacetophenone—1-3 weight percent.

8. The device recited in claim 1, wherein the triazine mixture comprises:
triazine—50-55 weight percent;
acrylated acrylonitrile butadiene rubber—20-30 weight percent;
half acrylate of the diglycidyl ether of bisphenol-A—5-15 weight percent;
N-vinylpyrrolidone—5-12 weight percent;
trimethylolpropanetriacrylate—2-4 weight percent;
glycidoxypropyltrimethoxysilane—1-5 weight percent;
2,2-dimethoxy-2-phenylacetophenone—1-3 weight percent;
pigment—0.25-1 weight percent;
surfactant—0.1-1 weight percent; and
stabilizer—0.2-1 weight percent.

9. An electronic device having a layer thereon which layer is formed from a photodefinable triazine based mixture wherein the triazine comprises from 40-65 weight percent of the mixture.

* * * * *